United States Patent
Koini et al.

(10) Patent No.: US 11,212,947 B2
(45) Date of Patent: Dec. 28, 2021

(54) POWER MODULE WITH CAPACITOR CONFIGURED FOR IMPROVED THERMAL MANAGEMENT

(71) Applicant: EPCOS AG, Munich (DE)

(72) Inventors: Markus Koini, Seiersberg (AT); Jürgen Konrad, Graz (AT); Georg Kügerl, Eibiswald (AT)

(73) Assignee: EPCOS AG, Munich (DE)

( * ) Notice: Subject to any disclaimer, the term of this patent is extended or adjusted under 35 U.S.C. 154(b) by 52 days.

(21) Appl. No.: 16/090,747

(22) PCT Filed: Apr. 5, 2017

(86) PCT No.: PCT/EP2017/058125
§ 371 (c)(1),
(2) Date: Oct. 2, 2018

(87) PCT Pub. No.: WO2017/174662
PCT Pub. Date: Oct. 12, 2017

(65) Prior Publication Data
US 2019/0116687 A1    Apr. 18, 2019

(30) Foreign Application Priority Data

Apr. 6, 2016  (DE) .......................... 102016106284.7

(51) Int. Cl.
*H05K 7/20* (2006.01)
*H01G 4/30* (2006.01)
(Continued)

(52) U.S. Cl.
CPC ......... *H05K 7/2089* (2013.01); *C04B 35/493* (2013.01); *C04B 37/006* (2013.01); *C04B 37/023* (2013.01); *H01G 4/008* (2013.01); *H01G 4/0085* (2013.01); *H01G 4/1218* (2013.01); *H01G 4/1245* (2013.01); *H01G 4/228* (2013.01); *H01G 4/30* (2013.01); *H01G 4/38* (2013.01); *H01G 4/40* (2013.01); *H01L 23/3735* (2013.01); *H01L 24/29* (2013.01); *H01L 24/32* (2013.01); *H01L 24/83* (2013.01);
(Continued)

(58) Field of Classification Search
CPC .................................................... H05K 7/2089
USPC ........................................................ 257/705
See application file for complete search history.

(56) References Cited

U.S. PATENT DOCUMENTS 5,444,296 A * 8/1995 Kaul ................. H01L 23/49816
                                                                 257/686
5,936,399 A    8/1999 Andermo et al.
(Continued)

FOREIGN PATENT DOCUMENTS

CN        1215150 A    4/1999
CN      101325165 A   12/2008
(Continued)

OTHER PUBLICATIONS

Dr. R. Bayerer, "Basics of Thermal Management"; ECPE Tutorial Power Electronics Packaging; Sep. 24-25, 2014 (62 pages).
(Continued)

*Primary Examiner* — Ajay Arora
(74) *Attorney, Agent, or Firm* — Nixon Peabody LLP

(57) ABSTRACT

A module having a power semiconductor device and a ceramic capacitor which is configured for cooling the power semiconductor device.

43 Claims, 1 Drawing Sheet

(51) Int. Cl.
  *H01G 4/38* (2006.01)
  *H01G 4/40* (2006.01)
  *H01G 4/12* (2006.01)
  *C04B 35/493* (2006.01)
  *H01G 4/008* (2006.01)
  *C04B 37/00* (2006.01)
  *C04B 37/02* (2006.01)
  *H01G 4/228* (2006.01)
  *H01L 23/373* (2006.01)
  *H01L 23/00* (2006.01)
  *H01L 25/16* (2006.01)
  *H01L 49/02* (2006.01)
  *H01G 2/08* (2006.01)

(52) U.S. Cl.
  CPC ............. *H01L 25/16* (2013.01); *H01L 28/55* (2013.01); *H01L 28/87* (2013.01); *C04B 2235/3224* (2013.01); *C04B 2235/3225* (2013.01); *C04B 2235/3227* (2013.01); *C04B 2235/3229* (2013.01); *C04B 2235/3249* (2013.01); *C04B 2235/3279* (2013.01); *C04B 2235/3281* (2013.01); *C04B 2235/3296* (2013.01); *C04B 2235/3298* (2013.01); *C04B 2235/3418* (2013.01); *C04B 2235/768* (2013.01); *C04B 2235/79* (2013.01); *C04B 2237/125* (2013.01); *C04B 2237/346* (2013.01); *C04B 2237/348* (2013.01); *C04B 2237/40* (2013.01); *C04B 2237/72* (2013.01); *H01G 2/08* (2013.01); *H01L 2224/29139* (2013.01); *H01L 2224/32265* (2013.01); *H01L 2224/8384* (2013.01); *H01L 2924/19041* (2013.01); *H01L 2924/19104* (2013.01)

(56) References Cited

U.S. PATENT DOCUMENTS

| | | | |
|---|---|---|---|
| 8,035,981 B2 | 10/2011 | Shioga et al. | |
| 8,766,419 B2 * | 7/2014 | Lim | H01L 23/49861 |
| | | | 257/676 |
| 9,293,256 B2 | 3/2016 | Engel et al. | |
| 2004/0184219 A1 | 9/2004 | Otsuka et al. | |
| 2007/0035013 A1 * | 2/2007 | Handa | H01L 23/5389 |
| | | | 257/717 |
| 2007/0125449 A1 * | 6/2007 | Kajiwara | H01L 24/37 |
| | | | 148/23 |
| 2007/0133147 A1 * | 6/2007 | Ritter | H01G 4/30 |
| | | | 361/306.3 |
| 2008/0010798 A1 | 1/2008 | Borland | |
| 2011/0075451 A1 * | 3/2011 | Bayerer | H01L 24/06 |
| | | | 363/37 |
| 2011/0294265 A1 | 12/2011 | Shioga | |
| 2012/0281335 A1 | 11/2012 | Engel | |
| 2014/0184219 A1 | 7/2014 | Kim | |
| 2015/0131200 A1 | 5/2015 | Engel et al. | |
| 2015/0326221 A1 | 11/2015 | Totani | |
| 2015/0371778 A1 * | 12/2015 | Engel | H01G 4/224 |
| | | | 361/301.4 |
| 2018/0033556 A1 * | 2/2018 | Itamochi | H01G 4/2325 |

FOREIGN PATENT DOCUMENTS

| | | | | |
|---|---|---|---|---|
| CN | 102667979 A | 9/2012 | | |
| CN | 102751268 A | 10/2012 | | |
| CN | 202996592 U | 6/2013 | | |
| CN | 104221175 A | 12/2014 | | |
| CN | 104335307 A | 2/2015 | | |
| DE | 19611046 A1 | 9/1997 | | |
| DE | 10100620 A1 | 12/2001 | | |
| DE | 10141877 A1 | 3/2003 | | |
| DE | 102013200242 A1 | 7/2014 | | |
| DE | 102013102278 A1 * | 9/2014 | ............ | H01G 4/232 |
| DE | 102014213784 A1 | 1/2016 | | |
| JP | 2002-233140 A | 8/2002 | | |
| JP | 2004-304158 A | 10/2004 | | |
| JP | 2009-059944 A | 3/2009 | | |
| JP | 2009-267310 A | 11/2009 | | |
| JP | 2013-222950 A | 10/2013 | | |
| JP | 2014-029944 A | 2/2014 | | |
| JP | 2015-133360 A | 7/2015 | | |
| JP | 2015-518459 A | 7/2015 | | |

OTHER PUBLICATIONS

S. Roy et al.; "Dielectric properties of chemically synthesized PLZT and PZT: diffused phase transition and effect of lead non-stoichiometry"; Journal of Physics D: Applied Physics, vol. 40, No. 15, pp. 4668-4673; Jul. 20, 2007; ISSN: 0022-3727 (6 pages).

Schweizer AG; "µ² Pack"; retrieved on Apr. 27, 2016, from http://www.schweizer.ag/de/produktloesungen/embedding.html; (1 page).

Schweizer AG; "Better populating options: the Cavity Board"; retrieved on Apr. 27, 2016, from http://www.schweizer.ag/de/produktloesungen/embedding.html; (1 page).

Schweizer AG; "Constantly ideal temperatuve: the Cool Board"; retrieved on Apr. 27, 2016, from http://www.schweizer.ag/de/produktloesungen/leistungselektronik.html; (1 page).

Schweizer AG; "Running high power through complex switch arrangements: Heavy Copper Board"; retrieved on Apr. 27, 2016, from http://www.schweizer.ag/de/produktloesungen/leistungselektronik.html; (1 page).

Schweizer AG; "Secure and reliable at lower costs: the Inlay Board"; retrieved on Apr. 27, 2016, from http://www.schweizer.ag/de/produktloesungen/leistungselektronik.html; (1 page).

Schweizer AG; "p² Pack the Power Embedding Solutions"; retrieved on Apr. 27, 2016, from http://www.schweizer.ag/de/produktloesungen/embedding.html; (1 page).

Schweizer AG; "Heavy copper and fine line technology on one PCB: the Power Combi Board"; retrieved on Apr. 27, 2016, from http://www.schweizer.ag/de/produktloesungen/leistungselektronik.html; (1 page).

Schweizer AG; "Integration of components on the PCB: The i² Board"; retrieved on Apr. 27, 2016, from http://www.schweizer.ag/de/produktloesungen/embedding.html; (1 page).

Schweizer AG; "Dissipate high temperatures from PCB: the IMS Board"; retrieved on Apr. 27, 2016, from https://www.schweizer.ag/en/products-solutions/power-electronics/ims-board.html (1 page).

Schweizer AG; "Dissipate high temperatures from PCB: the IMSBoard"; retrieved on Apr. 27, 2016, from http://www.schweizer.ag/de/produktloesungen/leistungselektronik.html; (1 page).

* cited by examiner

POWER MODULE WITH CAPACITOR CONFIGURED FOR IMPROVED THERMAL MANAGEMENT

CROSS-REFERENCE TO RELATED APPLICATIONS

This application is a U.S. National Stage of International Application No. PCT/EP2017/058125, filed Apr. 5, 2017, which claims the benefit of Germany Patent Application No. 102016106284.7, filed Apr. 6, 2016, both of which are incorporated herein by reference in their entireties.

The present invention relates to a module which comprises a power semiconductor device.

The present invention relates more particularly to the problem of cooling power semiconductor devices. In order to achieve a high integration and a high packing density in a module comprising a power semiconductor device, it is required to effectively thermally manage the elements of the module.

Power semiconductor devices which can be connected to a cooling body are known from the prior art. Spatially separate therefrom, there is often an intermediate circuit or snubber power capacitor which is used for voltage stabilization during operation of the power semiconductor device.

The object of the present invention is now to provide an improved module which has e.g. a high integration and/or a high packing density.

This object is achieved by a module according to the present claim 1.

A module is proposed which comprises a power semiconductor device and a ceramic capacitor which is configured for cooling the power semiconductor device.

By virtue of the fact that the ceramic capacitor is used to cool the power semiconductor device, an additional cooling body can be omitted. In this manner, the design of a more compact module can be enabled. Furthermore, in this manner, a spatial separation between the ceramic capacitor and the power semiconductor device can be omitted. As a result, the line paths between the ceramic capacitor and the power semiconductor device can be shortened. This is advantageous for the electrical function of the module because parasitic inductances, which are produced through the line paths between the power semiconductor device and the capacitor, can be substantially reduced. A reduction in the parasitic inductances is important e.g. for power semiconductor devices which comprise a switch or form a circuit in order to reduce overvoltages when switching the power semiconductor device.

"Module" is understood here to mean a component arrangement which comprises at least the power semiconductor device and the ceramic capacitor, wherein the component arrangement can be installed as a unit in a circuit arrangement. For example, the component arrangement can be secured as a unit to a printed circuit board. The elements of the module, i.e. at least the power semiconductor device and the ceramic capacitor can be arranged in a common housing.

The power semiconductor device can be any semiconductor device. In particular, the power semiconductor device can be a device which in power electronics is designed for controlling and switching high electrical currents and voltages. It can be e.g. a power diode, a thyristor, a triac or a transistor.

The power semiconductor device can comprise a substrate in which semiconductor elements are embedded. The substrate can comprise e.g. a material of the class FR-4. The substrate can be designed such that it has a high electrical and thermal conductivity and furthermore meets high thermomechanical stress requirements.

The ceramic capacitor can be a multi-layer device in which layers of a ceramic material and inner electrodes are stacked one above the other in an alternating manner in a stacking direction. Furthermore, the ceramic capacitor can comprise two outer electrodes, wherein each of the inner electrodes can be connected to one of the outer electrodes.

The ceramic capacitor and the power semiconductor device are connected together by a layer at least comprising silver as a constituent. The layer can have good thermal conductivity and in this manner can enable heat to be dissipated from the power semiconductor device. Accordingly, owing to its high thermal conductivity, the layer can support the capacitor in its cooling function.

The layer can comprise silver as the main constituent. Alternatively, the layer can be a silver-containing alloy in which silver is not the main constituent.

The ceramic capacitor can comprise a lead-lanthanum-zirconate-titanate (PLZT) ceramic. This ceramic likewise comprises a high thermal conductivity and as a result can contribute to the cooling function of the capacitor. Furthermore, the PLZT ceramic can be combined with inner electrodes which consist of copper. Copper is particularly well suited here as a material for the inner electrodes of the capacitor because copper has a high thermal conductivity.

The layer, via which the ceramic capacitor and the power semiconductor device can be connected together, can consist of at least 99 wt. % silver. The layer, via which the ceramic capacitor and the power semiconductor device can be connected together, can have been produced in a sintering process.

The ceramic capacitor can form a support to which the power semiconductor device is secured. The ceramic capacitor can be used as a substrate for the power semiconductor device.

Accordingly, in a flip-chip assembly of the module, the ceramic capacitor can be secured directly to a printed circuit board which forms e.g. a circuit arrangement. The module can also be secured to the printed circuit board in a surface-mounted assembly as a so-called Surface Mounted Device (SMD element), wherein the ceramic capacitor can thereby be secured directly to the printed circuit board. Alternatively, the module can also be secured to a printed circuit board in a surface-mounted assembly with the lateral surface facing away from the capacitor.

The module can be in particular free of a support or a substrate which does not assume any electrical function and is merely used to secure the elements of the module. Rather, the elements of the module can be secured to each other by using the capacitor as a support, and therefore a separate support can be omitted and a compact, space-saving configuration of the module is enabled.

The ceramic capacitor and the power semiconductor device can be connected together via a silver-comprising layer which was produced in a sintering process. The layer can consist of 99 wt. % silver. The ceramic capacitor can be connected to the power semiconductor device via the layer mechanically and can also be contacted thereby electrically.

The silver-comprising layer can have a high thermal conductivity and accordingly can contribute to effectively dissipating away heat, generated by the power semiconductor device, via the ceramic capacitor. Furthermore, the silver-comprising layer can have a coefficient of thermal expansion which does not substantially differ from the coefficients of thermal expansion of the capacitor and the power semiconductor device. As a result, it can be ensured that in the event of changes in temperature and therewith-associated expansions of the silver-comprising layer, of the ceramic capacitor and of the power semiconductor device, no significant mechanical stresses occur within the module.

For example, the coefficients of thermal expansion of the capacitor, of the power semiconductor device and of the silver-comprising layer can differ from each other by no more than $10^{-5}$ K$^{-1}$, preferably by no more than $10^{-6}$ K$^{-1}$.

The ceramic capacitor and the power semiconductor device can be connected together by a sintering silver process. Thereby, a paste is applied between the ceramic capacitor and the power semiconductor component and this arrangement is subjected to a sintering process. In the sintering process, the paste is converted into the silver-comprising layer which mechanically secures the ceramic capacitor to the power semiconductor device.

The ceramic capacitor can comprise a ceramic material which has a dielectric constant of more than 2000 in an electrical field with a field strength between 5 kV/mm and 10 kV/mm and which is compatible with temperatures of at least 150° C. An electrical field strength between 5 kV/mm and 10 kV/mm may correspond to the operating field strength of the ceramic capacitor. Accordingly, the ceramic material of the ceramic capacitor may have the dielectric constant of more than 2000 during operation of the capacitor. The electrical field strength can be in particular 8 kV/mm.

A material is thereby described as being "compatible with a temperature" if a robustness of the material does not fall below a predefined threshold value at this temperature. If the material robustness falls below the threshold value, the risk of component failure considerably increases.

Accordingly, the ceramic material of the capacitor can be selected such that the capacitor also has a sufficient material robustness at temperatures of up to 150° C. and therefore the probability of failure of the module does not substantially increase at temperatures up to 150° C. These properties of the ceramic material can ensure that the ceramic capacitor is then also suitable for cooling the power semiconductor device when a large amount of heat is produced thereby owing to high current intensities. Damage to the capacitor by the heat can be avoided in this manner.

The ceramic material can be in particular a lead-zirconate-titanate doped with lanthanate which e.g. meets the following general formula:

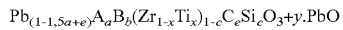

$$\mathrm{Pb}_{(1-1,5a+e)}\mathrm{A}_a\mathrm{B}_b(\mathrm{Zr}_{1-x}\mathrm{Ti}_x)_{1-c}\mathrm{C}_e\mathrm{Si}_c\mathrm{O}_3 + y \cdot \mathrm{PbO}$$

where A can be selected from the group consisting of La, Nd, Y, Eu, Gd, Tb, Dy, Ho, Er and Yb; C can be selected from the group consisting of Ni and Cu; and $0<a<0.12$
$0.05 \leq x \leq 0.3$
$0 \leq c<0.12$
$0.001<e<0.12$
$0 \leq y<1$ can be met.

This material is characterized in that it is compatible with temperatures of up to 150° C. with high dielectric constants of more than 2000 without demonstrating any substantial reduction in its robustness. Thereby, the material can then have this high dielectric constant even when it is subjected to an electrical field with a field strength of 5 kV/mm to 10 kV/mm. Therefore, it is particularly well suited to cool the power semiconductor device. Furthermore, a high capacitance of the ceramic capacitor can be formed by this material owing to the high dielectric constant. A high capacitance can positively influence the switching properties of the power semiconductor device.

The ceramic capacitor can be a ceramic multi-layer device and can comprise inner electrodes.

The inner electrodes can have a thermal conductivity of more than 100 W/mK. As a result, it can be ensured that heat radiated from the power semiconductor device can be dissipated rapidly and effectively via the inner electrodes.

Copper can be selected in particular as the material of the inner electrodes. Accordingly, the inner electrodes can comprise copper or consist of copper.

The module can comprise at least one further power semiconductor component, wherein the ceramic capacitor is configured for cooling the at least one further power semiconductor component. The ceramic capacitor can thus cool a plurality of power semiconductor components. Furthermore, the ceramic capacitor can be used as a support for a plurality of power semiconductor components.

The module can comprise at least one further capacitor, wherein the further capacitor is configured for cooling the power semiconductor device. The power semiconductor device can thus be cooled by a plurality of capacitors. A plurality of capacitors can form, when combined with each other, a support on which the power semiconductor device is arranged.

Furthermore, the module can comprise a control unit which is configured for controlling a function of the power semiconductor device. The power semiconductor device can have an upper side, on which the ceramic capacitor is arranged, and a lower side which is opposite the upper side and on which the control unit is arranged. Owing to the opposing "sandwich-like" arrangement of the ceramic capacitor and control unit in relation to the power semiconductor device, a particularly compact design of the module is enabled. This is characterized in particular by short line paths and low parasitic inductances associated therewith.

The power semiconductor device can comprise a switch. For example, the power semiconductor device can comprise a ceramic layer coated with metal which forms a semiconductor switch or a semiconductor diode.

The ceramic capacitor can be interconnected with the power semiconductor device such that the ceramic capacitor acts as an intermediate circuit capacitor or as a damping capacitor.

According to a further aspect, the present invention relates to a module which comprises a power semiconductor device and a ceramic capacitor which is configured for cooling the power semiconductor device, wherein the ceramic capacitor comprises a lead-lanthanum-zirconate-titanate ceramic. This ceramic is characterized by a high thermal conductivity.

The ceramic capacitor and the power semiconductor device can be connected together by a layer at least comprising silver as a constituent. The layer can consist of at least 99 wt. % silver.

The ceramic capacitor can form a support to which the power semiconductor device is secured.

The ceramic capacitor can comprise a ceramic material as per the general formula

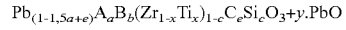

$$\mathrm{Pb}_{(1-1,5a+e)}\mathrm{A}_a\mathrm{B}_b(\mathrm{Zr}_{1-x}\mathrm{Ti}_x)_{1-c}\mathrm{C}_e\mathrm{Si}_c\mathrm{O}_3 + y \cdot \mathrm{PbO}$$

where A is selected from the group consisting of La, Nd, Y, Eu, Gd, Tb, Dy, Ho, Er and Yb; C is selected from the group consisting of Ni and Cu; and $0<a<0.12$, $0.05 \leq x \leq 0.3$, $0 \leq c<0.12$, $0.001<e<0.12$ and $0 \leq y<1$.

The ceramic capacitor can be a ceramic multi-layer device and can comprise inner electrodes.

The ceramic capacitor can comprise inner electrodes which have a thermal conductivity of more than 100 W/mK. The inner electrodes can comprise copper.

A set of advantageous aspects are mentioned hereinafter. The aspects are numbered so as to simplify reference of the aspects back to each other. Features of the aspects can be important when taken individually and when taken in combination with other aspects.

1. Module, comprising
    a power semiconductor device, and
    a ceramic capacitor which is configured for cooling the power semiconductor device.
2. Module according to the preceding aspect,
    wherein the ceramic capacitor forms a support to which the power semiconductor device is secured.
3. Module according to any one of the preceding aspects,
    wherein the ceramic capacitor and the power semiconductor device are connected together via a silver-comprising layer which was produced in a sintering process.
4. Module according to any one of the preceding aspects,
    wherein the ceramic capacitor comprises a ceramic material which has a dielectric constant of more than 2000 in an electrical field with a field strength between 5 kV/mm and 10 kV/mm and which is compatible with temperatures of at least 150° C.
5. Module according to any one of the preceding aspects,
    wherein the ceramic capacitor comprises a ceramic material as per the general formula

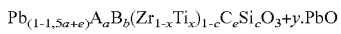
    $Pb_{(1-1,5a+e)}A_aB_b(Zr_{1-x}Ti_x)_{1-c}C_cSi_cO_3 + y \cdot PbO$ wherein
    A is selected from the group consisting of La, Nd, Y, Eu, Gd, Tb, Dy, Ho, Er and Yb;
    C is selected from the group consisting of Ni and Cu; and
    $0 < a < 0.12$
    $0.05 \leq x \leq 0.3$
    $0 \leq c < 0.12$
    $0.001 < e < 0.12$
    $0 \leq y < 1$.
6. Module according to any one of the preceding aspects,
    wherein the ceramic capacitor comprises inner electrodes which have a thermal conductivity of more than 100 W/mK.
7. Module according to any one of the preceding aspects,
    wherein the ceramic capacitor comprises inner electrodes which comprise copper.
8. Module according to any one of the preceding aspects,
    wherein the module further comprises a control unit which is configured for controlling a function of the power semiconductor device.
9. Module according to the preceding aspect,
    wherein the power semiconductor device comprises an upper side on which the ceramic capacitor is arranged, and
    wherein the power semiconductor device comprises a lower side which is opposite the upper side and on which the control unit is arranged.
10. Module according to any one of the preceding aspects,
    wherein the power semiconductor device comprises a switch.
11. Module according to any one of the preceding aspects,
    wherein the ceramic capacitor is interconnected with the power semiconductor device such that the ceramic capacitor acts as an intermediate circuit capacitor or as a damping capacitor.

The present invention will be described in more detail hereinafter with the aid of the figures.

Figure 1:
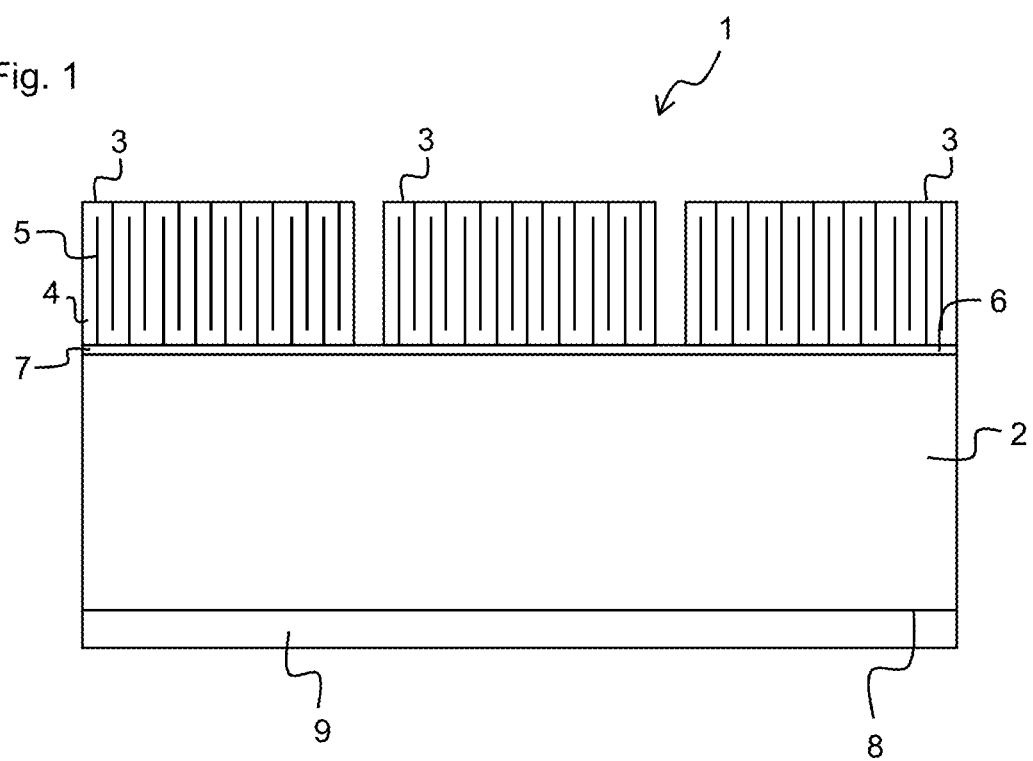
FIG. 1 shows a module according to a first exemplary embodiment.

FIG. 1 shows a first exemplary embodiment of a module 1. The module 1 comprises a power semiconductor device 2. The power semiconductor device 2 can be configured e.g. to form a circuit which assumes a switching function. Accordingly, the power semiconductor device 2 can comprise a switch. The power semiconductor device 2 can comprise a substrate into which semiconductor elements are integrated.

The module 1 further comprises a ceramic capacitor 3. The ceramic capacitor 3 assumes a dual function. The ceramic capacitor 3 is a capacitor which is connected to a circuit formed by the power semiconductor device 2. Thereby, the ceramic capacitor 3 can be e.g. an intermediate circuit capacitor or a snubber capacitor. A snubber capacitor is a capacitor which has a damping effect, is used for voltage stabilization and should prevent voltage peaks.

Furthermore, the ceramic capacitor 3 assumes the functionality of a cooling body. In particular, the ceramic capacitor 3 cools the power semiconductor device 2 during operation. The materials of the ceramic capacitor 3 are selected such that the ceramic capacitor 3 is suitable on the one hand for dissipating heat, generated by the power device 2, away therefrom and on the other hand is not damaged by the heat.

The ceramic capacitor 3 comprises a ceramic material 4 and inner electrodes 5. The ceramic material 4 can be lead-zirconate-titanate (PLZT) doped with lanthanate. This material 4 has a high dielectric constant, whereby a high capacitance of the capacitor 3 is enabled, and is heat-resistant, and therefore it is not damaged by the heat radiated from the power semiconductor device 2.

The inner electrodes 5 and the ceramic material 4 are stacked in the ceramic capacitor one above the other in an alternating manner in a stacking direction. The stacking direction is in parallel with an upper side 6 of the power semiconductor device 2. Accordingly, the inner electrodes 5 are perpendicular to the upper side 6.

The inner electrodes 5 can comprise copper or consist of copper. If copper is selected as the material of the inner electrodes 5, inner electrodes 5 having a high thermal conductivity can be produced in this manner. Owing to the high thermal conductivity of the inner electrodes 5, these are suitable for quickly and effectively dissipating heat, radiated from the power semiconductor device 2, away therefrom.

The heat can thereby be output from the upper side 6 of the power semiconductor device 2 to the ceramic capacitor 3. Then, the heat can be directed via the inner electrodes 5 to an upper side of the ceramic capacitor 3 which faces away from the power semiconductor device 2. The heat is now radiated from the upper side of the ceramic capacitor 3 to the area surrounding the module 1. In this manner, the heat is dissipated away from the power semiconductor device 2, and therefore overheating of the power semiconductor device 2 is prevented.

Furthermore, the capacitor 3 comprises two outer electrodes which are not shown in FIG. 1 so as to simplify the illustration. The outer electrodes can likewise comprise copper or consist of copper. The outer electrodes can thus effectively further dissipate the heat generated by the power semiconductor device 2.

In an alternative exemplary embodiment, not shown, the inner electrodes 5 are arranged in parallel with the upper side 6 of the power semiconductor device 2. In this case, the ceramic capacitor 3 can comprise a connecting apparatus, e.g. a copper frame. The inner electrodes 5 can be contacted by the power semiconductor device 2 via the connecting apparatus. In this case, heat radiated from the power semiconductor device 2 is received by the connecting apparatus and is transferred to the inner electrodes 5. These can in turn dissipate the heat away from the power semiconductor device 2 and ultimately ensure that the heat can be output to the surrounding area.

The ceramic capacitor 3 is secured to the power semiconductor device 2 by a silver-comprising layer 7 and is also electrically contacted by the power semiconductor device 2 via this layer 7. The silver-comprising layer 7 is produced in a sintering process. This layer 7 is characterized by a particularly high thermal conductivity.

A control unit 9 is arranged on a lower side 8 of the power semiconductor device 2 opposite the upper side 6. The control unit 9 is interconnected with the power semiconductor device 2. The control unit 9 is configured in particular for controlling a function of the power semiconductor device 2.

Owing to the arrangement, shown in FIG. 1, of the ceramic capacitor 3, the power semiconductor device 2 and the control unit 9 in the immediate vicinity of one another, it can be ensured that the module 1 has a very compact design and in particular short conductor paths are enabled between the capacitor 3 and the power semiconductor device 2 and between the control unit 9 and the power semiconductor device 2. Owing to the short conductor paths, parasitic inductances can be minimized in this module design.

In the exemplary embodiment shown in FIG. 1, a plurality of capacitors 3 are arranged on a single power semiconductor device 2, wherein each of these capacitors 3 assumes the function of a cooling body and is accordingly configured for cooling the power semiconductor device 2.

Figure 2:
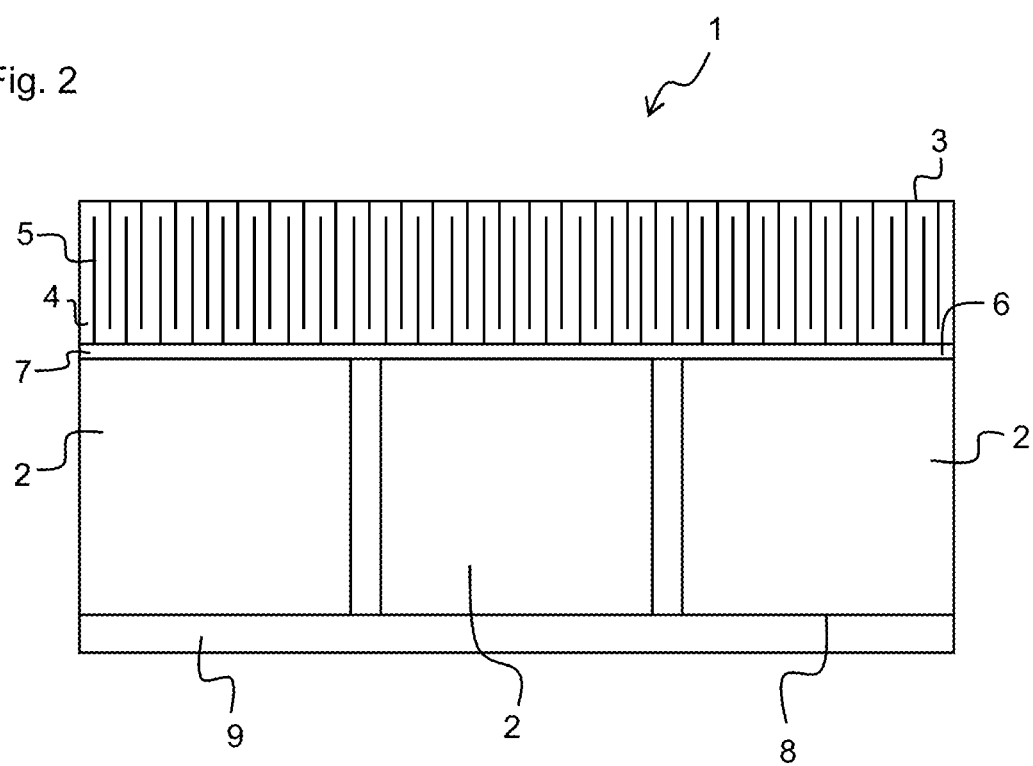
FIG. 2 shows a module according to a second exemplary embodiment.

FIG. 2 shows a second exemplary embodiment of the module 1. The second exemplary embodiment comprises a single ceramic capacitor 3 which is suitable for cooling one or more of the power semiconductor devices 2. A plurality of power semiconductor devices 2 are arranged on the ceramic capacitor 3. Thereby, these are connected to the capacitor 3, again by a silver-comprising layer 7. The ceramic capacitor 3 is hereby used as a substrate or support for the power semiconductor devices 2.

The module 1 is suitable for being secured to a printed circuit board in a surface-mounted assembly. The ceramic capacitor 3 is hereby secured to the printed circuit board with its side facing away from the power semiconductor device 2. Alternatively, the control unit 9 can be secured to the printed circuit board with its side facing away from the power semiconductor device 2.

LIST OF REFERENCE NUMERALS

1 Module
2 Power semiconductor device
3 Capacitor
4 Ceramic material
5 Inner electrode
6 Upper side
7 Silver-comprising layer
8 Lower side
9 Control unit

The invention claimed is:

1. Module, comprising
a power semiconductor device,
a ceramic capacitor which is configured for cooling the power semiconductor device, and
at least one further capacitor also configured to cool the power semiconductor device,
wherein the ceramic capacitor and the power semiconductor device are connected together by a layer at least comprising silver as a constituent, and
wherein the coefficients of thermal expansion of the ceramic capacitor, of the power semiconductor device and of the silver-comprising layer differ from each other by no more than $10^{-5}$ $K^{-1}$, and
wherein the module further comprises a control unit configured to control a function of the power semiconductor device, wherein the power semiconductor device includes an upper side on which the ceramic capacitor is arranged, and wherein the power semiconductor device includes a lower side that is opposite the upper side, the control unit being arranged directly on the lower side.

2. Module according to claim 1,
wherein the ceramic capacitor comprises a lead-lanthanum-zirconate-titanate ceramic.

3. Module according to claim 1,
wherein the layer, via which the ceramic capacitor and the power semiconductor device are connected together, includes at least 99 wt. % silver.

4. Module according to claim 1,
wherein the layer, via which the ceramic capacitor and the power semiconductor device are connected together, has been produced in a sintering process.

5. Module according to claim 1,
wherein the ceramic capacitor forms a support to which the power semiconductor device is secured.

6. Module according to claim 1,
wherein the ceramic capacitor comprises a ceramic material which has a dielectric constant of more than 2000 in an electrical field with a field strength between 5 kV/mm and 10 kV/mm and which is compatible with temperatures of at least 150° C.

7. Module according to claim 1,
wherein the ceramic capacitor comprises a ceramic material having a formulation $$Pb_{(1-1.5a+e)}A_aB_b(Zr_{1-x}Ti_x)_{1-c}C_eSi_cO_3 + y \cdot PbO$$

wherein
A is selected from the group consisting of La, Nd, Y, Eu, Gd, Tb, Dy, Ho, Er and Yb;
C is selected from the group consisting of Ni and Cu; and
$0 < a < 0.12$
$0.05 \leq x \leq 0.3$
$0 \leq c < 0.12$
$0.001 < e < 0.12$
$0 \leq y < 1$.

8. Module according to claim 7,
wherein the ceramic capacitor is a ceramic multi-layer device and comprises inner electrodes.

9. Module according to claim 8,
wherein the inner electrodes have a thermal conductivity of more than 100 W/mK.

10. Module according to claim 8,
wherein the inner electrodes comprise copper.

11. Module according to claim 7,
comprising at least one further power semiconductor component, wherein the ceramic capacitor is configured for cooling the at least one further power semiconductor component.

12. Module according to claim 7,
wherein the module further comprises a control unit which is configured for controlling a function of the power semiconductor device.

13. Module according to claim 12,
wherein the power semiconductor device comprises an upper side on which the ceramic capacitor is arranged, and
wherein the power semiconductor device comprises a lower side which is opposite the upper side and on which the control unit is arranged.

14. Module according to claim 7,
wherein the power semiconductor device comprises a switch.

15. Module according to claim 7,
wherein the ceramic capacitor is interconnected with the power semiconductor device such that the ceramic capacitor acts as an intermediate circuit capacitor or as a damping capacitor.

16. Module, comprising
a power semiconductor device,
a ceramic capacitor which is configured for cooling the power semiconductor device, and
at least one further capacitor configured to cool the power semiconductor device,
wherein the ceramic capacitor comprises a lead-lanthanum-zirconate-titanate ceramic, and
wherein the ceramic capacitor and the power semiconductor device are connected together by a layer at least comprising silver as a constituent, wherein the coefficients of thermal expansion of the ceramic capacitor, of the power semiconductor and of the silver-comprising layer differ from each other by no more than $10^{-5}$ $K^{-1}$, wherein the module further comprises a control unit configured to control a function of the power semiconductor device, wherein the power semiconductor device includes an upper side on which the ceramic capacitor is arranged, and wherein the power semiconductor device includes a lower side that is opposite the upper side, the control unit being arranged directly on the lower side.

17. Module according to claim 16,
wherein the ceramic capacitor and the power semiconductor device are connected together by a layer at least comprising silver as a constituent.

18. Module according to claim 17,
wherein the layer, via which the ceramic capacitor and the power semiconductor device are connected together, includes at least 99 wt. % silver.

19. Module according to claim 16,
wherein the ceramic capacitor forms a support to which the power semiconductor device is secured.

20. Module according to claim 16,
wherein the ceramic capacitor comprises a ceramic material having a formulation $$Pb_{(1-1,5a+e)}A_aB_b(Zr_{1-x}Ti_x)_{1-c}C_eSi_cO_3+y.PbO$$

wherein
A is selected from the group consisting of La, Nd, Y, Eu, Gd, Tb, Dy, Ho, Er and Yb;
C is selected from the group consisting of Ni and Cu; and
$0<a<0.12$
$0.05 \leq x \leq 0.3$
$0 \leq c<0.12$
$0.001<e<0.12$
$0 \leq y<1$.

21. Module according to claim 16,
wherein the ceramic capacitor is a ceramic multi-layer device and comprises inner electrodes.

22. Module according to claim 16,
wherein the ceramic capacitor comprises inner electrodes, and wherein the inner electrodes have a thermal conductivity of more than 100 W/mK.

23. Module according to claim 16,
wherein the ceramic capacitor comprises inner electrodes, and wherein the inner electrodes comprise copper.

24. Module according to claim 17,
wherein the layer, via which the ceramic capacitor and the power semiconductor device are connected together, has been produced in a sintering process.

25. Module according to claim 16,
wherein the ceramic capacitor comprises a ceramic material which has a dielectric constant of more than 2000 in an electrical field with a field strength between 5 kV/mm and 10 kV/mm and which is compatible with temperatures of at least 150° C.

26. Module according to claim 16,
comprising at least one further power semiconductor component, wherein the ceramic capacitor is configured for cooling the at least one further power semiconductor component.

27. Module according to claim 16,
wherein the module further comprises a control unit which is configured for controlling a function of the power semiconductor device.

28. Module according to claim 16,
wherein the power semiconductor device comprises an upper side on which the ceramic capacitor is arranged, and
wherein the power semiconductor device comprises a lower side which is opposite the upper side and on which the control unit is arranged.

29. Module according to claim 16,
wherein the power semiconductor device comprises a switch.

30. Module according to claim 16,
wherein the ceramic capacitor is interconnected with the power semiconductor device such that the ceramic capacitor acts as an intermediate circuit capacitor or as a damping capacitor.

31. Module according to claim 16,
wherein the module is configured for being secured to a printed circuit board.

32. Module according to claim 16,
wherein the ceramic capacitor and the power semiconductor device are arranged in a common housing.

33. Module according to claim 16,
wherein the power semiconductor device comprises a substrate in which semiconductor elements are embedded.

34. Module according to claim 16,
wherein the capacitor comprises two outer electrodes.

35. Module according to claim 16,
wherein the outer electrodes comprise copper or consist of copper.

36. Module according to claim 7,
wherein the module is configured for being secured to a printed circuit board.

37. Module according to claim 7,
wherein the ceramic capacitor and the power semiconductor device are arranged in a common housing.

38. Module according to claim 7,
wherein the power semiconductor device comprises a substrate in which semiconductor elements are embedded.

39. Module according to claim 7,
wherein the capacitor comprises two outer electrodes.

40. Module according to claim 7,
wherein the outer electrodes comprise copper or consist of copper.

41. Module according to claim 7,
wherein the ceramic capacitor is a multi-layer device in which layers of a ceramic material and inner electrodes are stacked one above the other in an alternating manner in a stacking direction,
wherein the power semiconductor device comprises an upper side on which the ceramic capacitor is arranged,
wherein the inner electrodes are perpendicular to the upper side of the power semiconductor device.

42. Module according to claim 16,
wherein the ceramic capacitor is a multi-layer device in which layers of a ceramic material and inner electrodes are stacked one above the other in an alternating manner in a stacking direction,
wherein the power semiconductor device comprises an upper side on which the ceramic capacitor is arranged,
wherein the inner electrodes are perpendicular to the upper side of the power semiconductor device.

43. Module, comprising: a power semiconductor device, and a ceramic capacitor configured for cooling the power semiconductor device,
wherein the ceramic capacitor and the power semiconductor device are connected together by a layer at least comprising silver as a constituent,
wherein the module further comprises a control unit configured to control a function of the power semiconductor device,
wherein the power semiconductor device includes an upper side on which the ceramic capacitor is arranged, and
wherein the power semiconductor device includes a lower side which is opposite the upper side, the control unit being arranged directly on the lower side.

* * * * *

UNITED STATES PATENT AND TRADEMARK OFFICE
CERTIFICATE OF CORRECTION

PATENT NO. : 11,212,947 B2
APPLICATION NO. : 16/090747
DATED : December 28, 2021
INVENTOR(S) : Markus Koini et al.

It is certified that error appears in the above-identified patent and that said Letters Patent is hereby corrected as shown below:

In the Claims

At Column 8, Line 55 (Claim 8, Line 1), please delete "Module according to claim 7," and insert --Module according to claim 1,-- therefor.

At Column 9, Line 1 (Claim 12, Line 1), please delete "Module according to claim 7," and insert --Module according to claim 1,-- therefor.

At Column 9, Line 13 (Claim 14, Line 1), please delete "Module according to claim 7," and insert --Module according to claim 1,-- therefor.

At Column 9, Line 15 (Claim 15, Line 1), please delete "Module according to claim 7," and insert --Module according to claim 1,-- therefor.

At Column 10, Line 62 (Claim 36, Line 1), please delete "Module according to claim 7," and insert --Module according to claim 1,-- therefor.

At Column 10, Line 65 (Claim 37, Line 1), please delete "Module according to claim 7," and insert --Module according to claim 1,-- therefor.

At Column 11, Line 1 (Claim 38, Line 1), please delete "Module according to claim 7," and insert --Module according to claim 1,-- therefor.

At Column 11, Line 5 (Claim 39, Line 1), please delete "Module according to claim 7," and insert --Module according to claim 1,-- therefor.

At Column 11, Line 7 (Claim 40, Line 1), please delete "Module according to claim 7," and insert --Module according to claim 1,-- therefor.

Signed and Sealed this
Fifth Day of July, 2022

Katherine Kelly Vidal
*Director of the United States Patent and Trademark Office*

At Column 11, Line 10 (Claim 41, Line 1), please delete "Module according to claim 7," and insert --Module according to claim 1,-- therefor.